(12) United States Patent
Gabrisko, Jr. et al.

(10) Patent No.: US 6,413,119 B1
(45) Date of Patent: Jul. 2, 2002

(54) FILTERED ELECTRICAL CONNECTOR

(75) Inventors: Ronald E. Gabrisko, Jr., Mountain View, CA (US); Brian Matthew Donato; Burlyn Dean Nash, both of Warren, OH (US); Dominic Anthony Messuri, Canfield, OH (US); Randy Lynn Fink, Warren, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/332,916

(22) Filed: Jun. 14, 1999

(51) Int. Cl.[7] .............................................. H01R 13/66
(52) U.S. Cl. .................................................... 439/620
(58) Field of Search ........................... 439/620; 333/73, 333/181–185; 257/178, 177, 687, 666, 685; 361/694, 702, 704, 707–710, 697, 386; 228/180.1

(56) References Cited

U.S. PATENT DOCUMENTS

| | | | | |
|---|---|---|---|---|
| 4,959,626 A | * | 9/1990 | Mouissie | 33/182 |
| 5,066,931 A | * | 11/1991 | Thelissen | 333/182 |
| 5,101,322 A | * | 3/1992 | Ghaem et al. | 361/386 |
| 5,166,865 A | * | 11/1992 | Morrison et al. | 361/400 |
| 5,218,357 A | * | 6/1993 | Sukamto et al. | 342/351 |
| 5,236,376 A | * | 8/1993 | Cohen | 439/620 |
| 5,340,334 A | * | 8/1994 | Nguyen | 439/620 |
| 5,498,902 A | * | 3/1996 | Hara | 257/686 |
| 5,816,857 A | * | 10/1998 | Belopolski | 439/620 |
| 5,823,826 A | * | 10/1998 | Ward et al. | 439/620 |
| 6,071,128 A | * | 6/2000 | Brewington et al. | 439/73 |
| 6,078,229 A | * | 6/2000 | Funada et al. | 361/193 |
| 6,087,682 A | * | 7/2000 | Ando | 257/178 |
| 6,089,442 A | * | 7/2000 | Ouchi et al. | 228/180.1 |
| 6,101,096 A | * | 8/2000 | McGregor et al. | 361/720 |

OTHER PUBLICATIONS

IBM Technical Disclosure Bulletin, Thin–Film Modules with Matched Thermal expansion, Sep. 1986.*

* cited by examiner

Primary Examiner—Brian Sircus
Assistant Examiner—J. F. Duverne
(74) Attorney, Agent, or Firm—Patrick M. Griffin

(57) ABSTRACT

A filtered electrical connector has a die cast aluminum housing that is mounted to a printed circuit board for attaching wiring harnesses to the printed circuit board for transmitting electrical signals to and from the circuitry of the printed circuit board. The die cast housing has six compartments that have a socket on the bottom of the housing for receiving the end connector of one of the wiring harnesses. A plastic retainer that holds several contact pins is secured in the lower portion of each compartment. A plated plastic filter insert having an anistropic substrate and surface mounted capacitors is encapsulated in an enlarged upper portion of each compartment. The contact pins extend through the filter insert and a ferrite block that is embedded above the filter insert. The ferrite block is covered by an insulation sheet to avoid short circuits in the printed circuit board and protect against bent pins.

19 Claims, 5 Drawing Sheets

FILTERED ELECTRICAL CONNECTOR

TECHNICAL FIELD

This invention relates generally to electrical connectors and more particularly to electrical connectors having arrays of contact pins that are filtered and to filters for such connectors.

BACKGROUND OF THE INVENTION

The use of electronic computers and control devices in automotive vehicles increases each year. The number of such devices used in each vehicle increases as well as the complexity of the devices that are used. Hence there is need for electrical connectors for attaching wiring harnesses to the electronic computers and control devices that include electric filters to eliminate unwanted electrical signals and electromagnetic shields to eliminate or at least reduce electomagnetic interference that can cause cross talk between the various electronic devices.

A type of electric filter has been proposed that uses a flexible printed circuit with electric filter devices such as capacitors that are surface mounted on solder tabs of the flexible print circuit using well known soldering techniques. However, this type of filter has a drawback in that it is very difficult to establish electrical connections between the electric filter and the contact pins that extend through the flexible printed circuit because of the thinness of the flexible printed circuit.

SUMMARY OF THE INVENTION

The object of this invention is to provide a filtered electrical connector and electric filter therefor that uses a hardboard printed circuit that has a substantial thickness so that electrical connections between contact pins and the electric filter can be made easily using conventional soldering techniques.

A feature of the invention is that the filtered electrical connector and electric filter of the invention has a unique base and particular orientation of the electric filter devices on the base to enhance the integrity of the solder connections between the electric filter devices and conductive traces of the base.

Another feature of the invention is that the filtered electrical connector and electric filter of the invention has a filter base that includes a substrate with anistropic thermal expansion properties to reduce the effects of differential thermal expansion between the base and the electric filter devices that are connected to the base.

Still another feature of the invention is that the filtered electrical connector and electric filter of the invention has a filter base that is grounded easily.

Yet another feature of the invention is that the filtered electrical connector and electric filter of the invention has a filter base that accommodates a ferrite filter in a unique way.

These and other objects, features and advantages of the invention will become more apparent from the following description of a preferred embodiment taken in conjunction with the accompanying drawing.

DESCRIPTION OF THE PREFERRED EMBODIMENT

Figure 1:
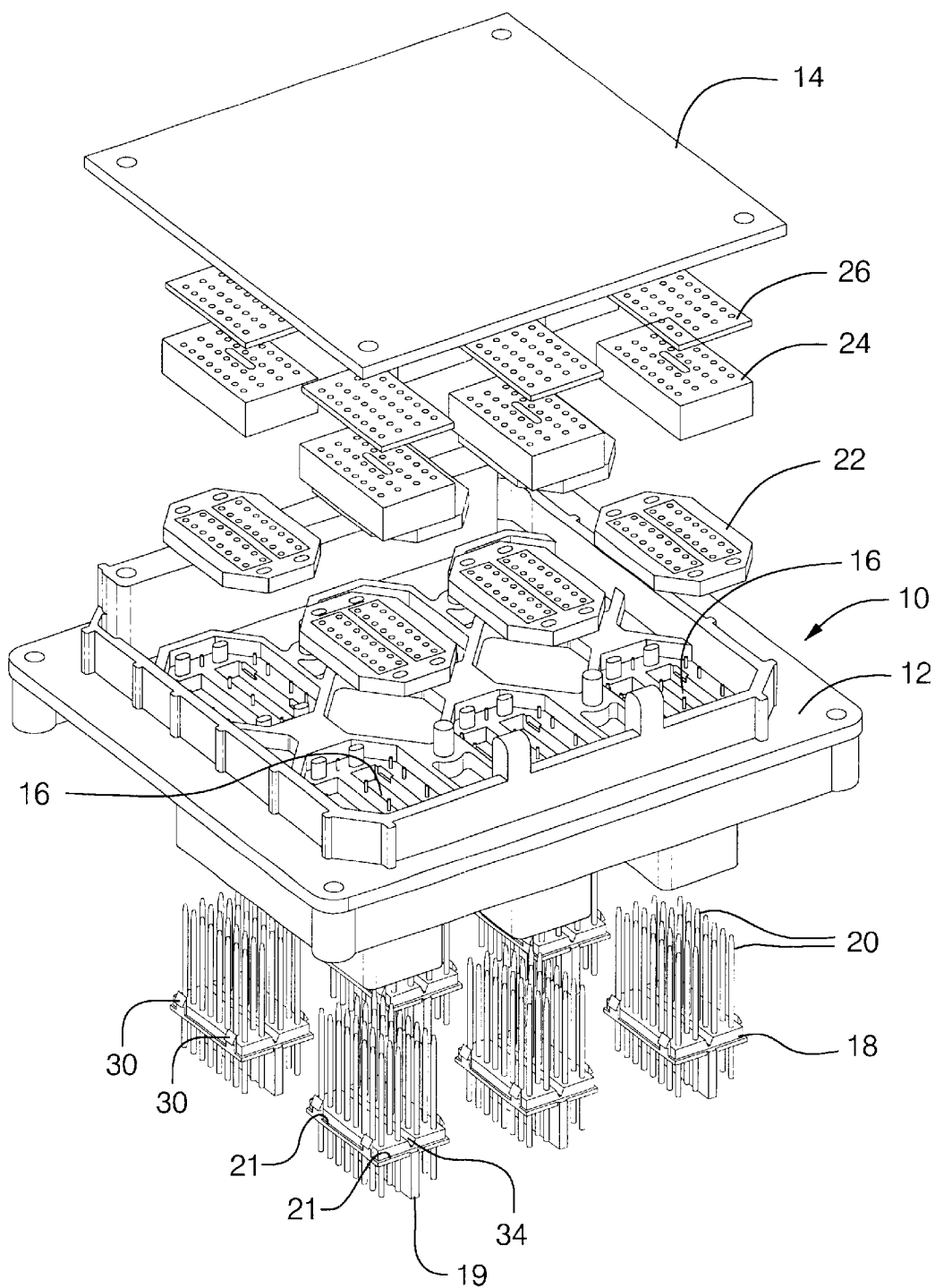
FIG. 1 is an exploded, perspective view of a printed circuit board equipped with a filtered electrical connector in accordance with the invention.

Referring now to FIG. 1, a filtered electrical connector 10 comprises a die cast housing 12 that is preferably made of aluminum or other light weight metal. Housing 12 is mounted to a printed circuit board 14 for attaching wiring harnesses (not shown) to the printed circuit board 14 for transmitting electrical signals to and from the circuitry of the printed circuit board. The die cast aluminum housing 12 has several compartments 16 that receive the end connector (not shown) of one of the wiring harnesses. A plastic pin retainer 18 that holds several round contact pins 20, an electric filter insert 22, a ferrite block 24 and an insulation sheet 26 are associated with each compartment.

Figure 2:
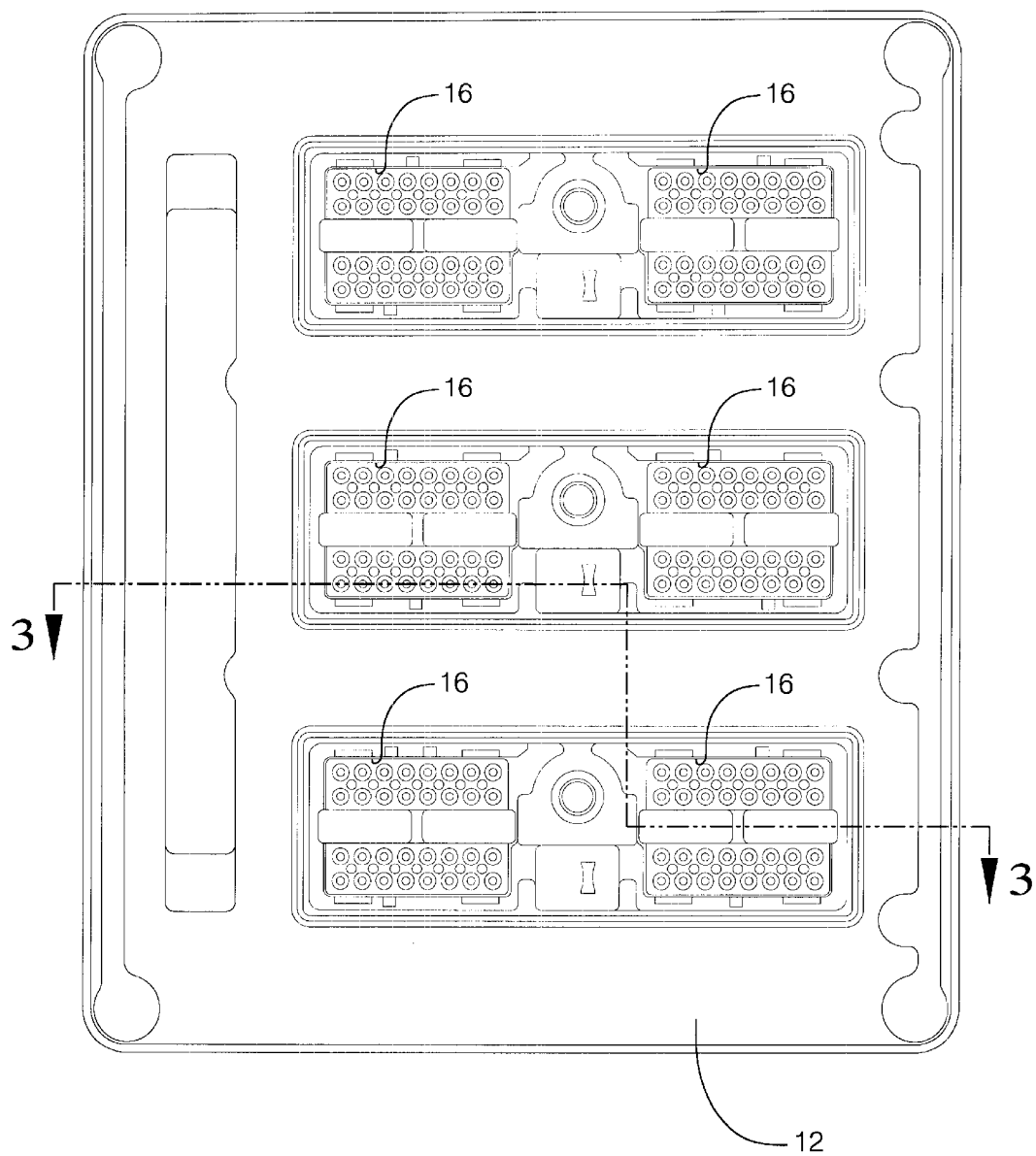
FIG. 2 is a bottom view of the filtered electrical connector shown in FIG. 1.
Figure 3:
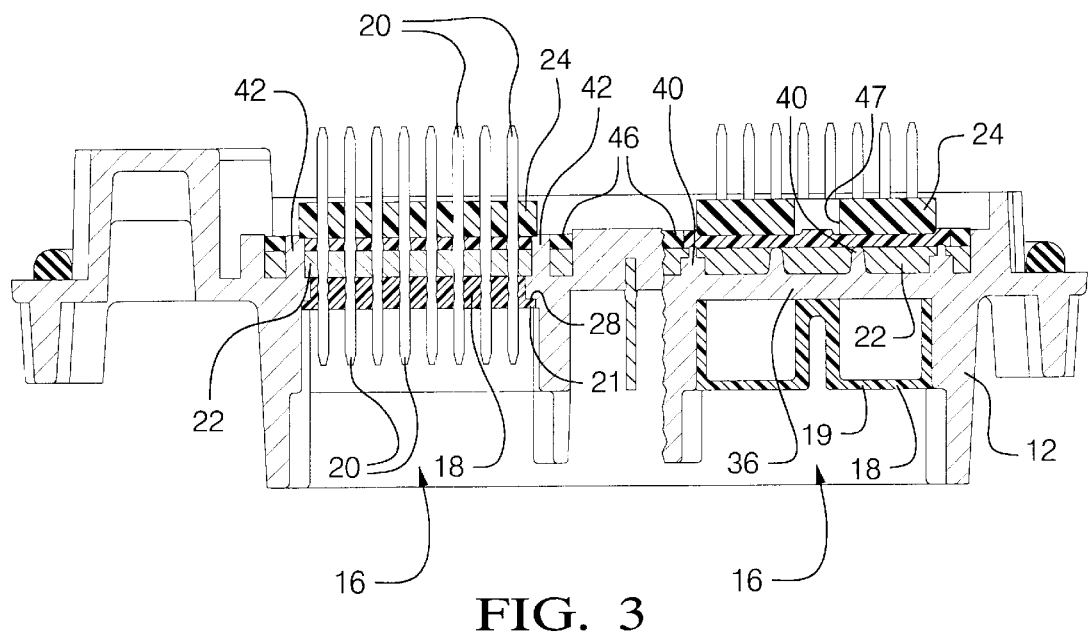
FIG. 3 is a section taken substantially along the line 3—3 of FIG. 2 looking in the direction of the arrows.

Die cast housing 12 has six (6) compartments that are arranged in three spaced pairs of compartments as shown in FIG. 2. FIG. 3 shows a typical pair of two side-by-side compartments 16. The plastic pin retainer 18 carries several round contact pins 20 extending through four rows of through holes. Retainer 18 is disposed in the lower portion of each compartment 16 and has a ledge 21 engaged against stop shoulders 28 in the compartment. Retainer 18 has a flexible lock arm 30 at each corner that engages one of four retention shoulders 32 in the compartment to secure pin retainer 18 in the lower portion of compartment 16.

Figure 4:
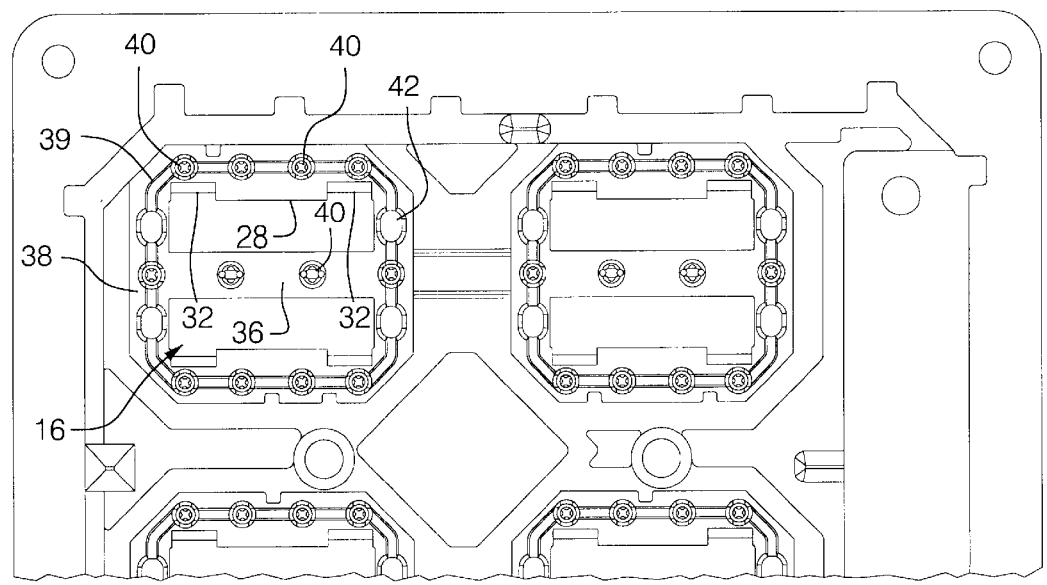
FIG. 4 is a partial top view of the housing for electrical connector shown in FIG. 1.

Pin retainer 18 has a central groove 34 that separates four rows of contact pins 20 into two groups of two rows each. Central groove 34 accommodates a cross bar 36 of housing 12 (as best shown in FIG. 4) located in compartment 16 to help support and ground filter insert 22. Pin retainer 18 also has depending portion 19 on the opposite side of groove 34 to facilitate insertion of retainer 18 into compartment 16.

When pin retainer 18 is assembled to housing 12, contact pins 20 extend downwardly a short distance for making electrical connections with the end connector of a wiring harness (not shown) that is plugged into a socket portion in the bottom of compartment 16. Contact pins 20 extend upwardly a considerable distance and project out of housing 12 to engage printed circuit board 14 as best shown in FIG. 3. Contact pins 20 include two star-shaped bands. One band is embedded in the surrounding through hole of pin retainer 18 to hold the round contact pin 20 in place. The other band is a short distance above pin retainer 18 for engaging a plated hole of filter insert 22 as explained below.

The upper portion of compartment 16 is shaped in an octagon and enlarged, relative to the lower portion, to provide a shelf 38 which has a peripheral rib 39 connecting several cast contact pins 40 and four cast pedestals 42 as best shown in FIG. 4. The upper surface of cross bar 36 also includes cast contact pins 40.

The plated plastic electric filter insert 22 is disposed in the upper portion of each compartment 16 with the cast contact pins 40 of housing 12 extending into round plated ground holes 44 of insert 22. Holes 44 have internal ribs so that the cast contact pins 40 are force fit into the holes to secure filter insert 22 precisely in the upper portion of compartment 16 and to establish good electrical contact between plated holes 44 and the cast contact pins 40 of housing 12.

Cast pedestals 42 extend through oval holes in filter insert 22 to support ferrite block 24 and rib 39 of shelf 38 extends into a peripheral groove in the bottom of filter insert 22. When filter insert 22 is installed contact pins 20 extend through plated through holes of filter insert 22 with the upper star shaped band embedded in the surrounding plated through hole to filter electrical signals passing through contact pins 20 as explained in detail below.

The ferrite block 24 having a pattern of through holes that matches the pattern of contact pins 20 is installed on contact pins 20 above filter 22 and supported by cast pedestals 42 which are notched on top to engage edges of ferrite block 24 as shown in FIG. 3. The enlarged upper portion of compartment 16 is filled with a fluid sealant 46 through a central hole 47 in ferrite block 24 that sets to encapsulate the filter insert 22 and embed the bottom of ferrite block 24; a silicone based encapsulant being suitable for such a purpose.

The insulation sheet 26 having a pattern of through holes that matches the pattern of contact pins 20 is installed on contact pins 20 above ferrite block 24 that has its bottom embedded in sealant 46. Insulation sheet 26 prevents short circuits when the filtered electrical connector 10 is mounted on printed circuit board 14. One insulation sheet may be used for a pair of compartments 16.

Figure 5:
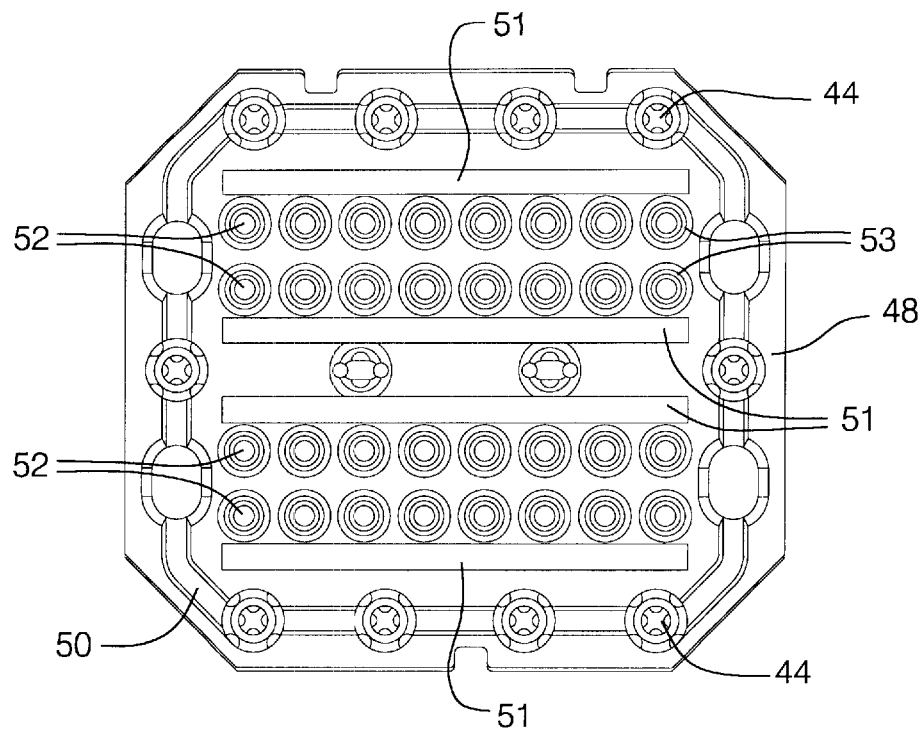
FIG. 5 is a bottom view of the filter insert for the electrical connector shown in FIG. 1.

The plated plastic filter insert 22 comprises a flat octagonal body 48 that fits into the upper end of compartment 16. The bottom surface of body 48 has a peripheral groove 50 that intersects the round and oval holes that receive cast contact pins 40 and pedestals 42 of housing 12 and four parallel grooves 51 as shown in FIG. 5. As indicated above, groove 50 receives housing rib 39 to prevent encapsulant from leaking through to mating connector side.

Figure 6:
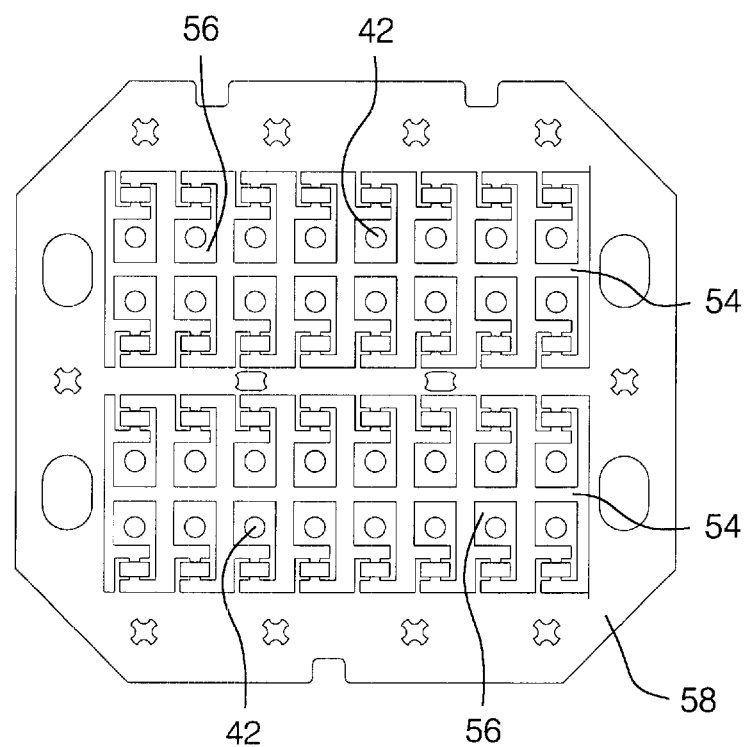
FIG. 6 is a top view of the filter insert shown in FIG. 5.

Body 48 also has two round, centrally located holes for receiving cast contact pins 40 integrally attached to cross bar 36 and a pattern of holes 52 that matches the pattern of contact pins 20. Body 48 is a plated plastic comprising a thermoplastic substrate with anistropic properties coated with copper and tin platings on nearly all surface areas. The entire inner surfaces of all holes including holes 44 and 52 and the bottom surface is plated except for the small ring areas 53 around holes 52. The upper surface of body 48 is also plated except for labyrinth areas 54 that create several contact pads 56 for plated holes 52 and an upper surface ground plane 58 that surrounds the contact pads 56 as shown in FIG. 6. In fact the entire surface of body 48 is plated (except for ring areas 53 and labyrinth areas 54) so that upper ground plane 58 is grounded to aluminum housing 12 via the plated holes 44 and/or the lower plated surface of filter insert 22 when the filter insert is installed in housing 12.

Figure 7:
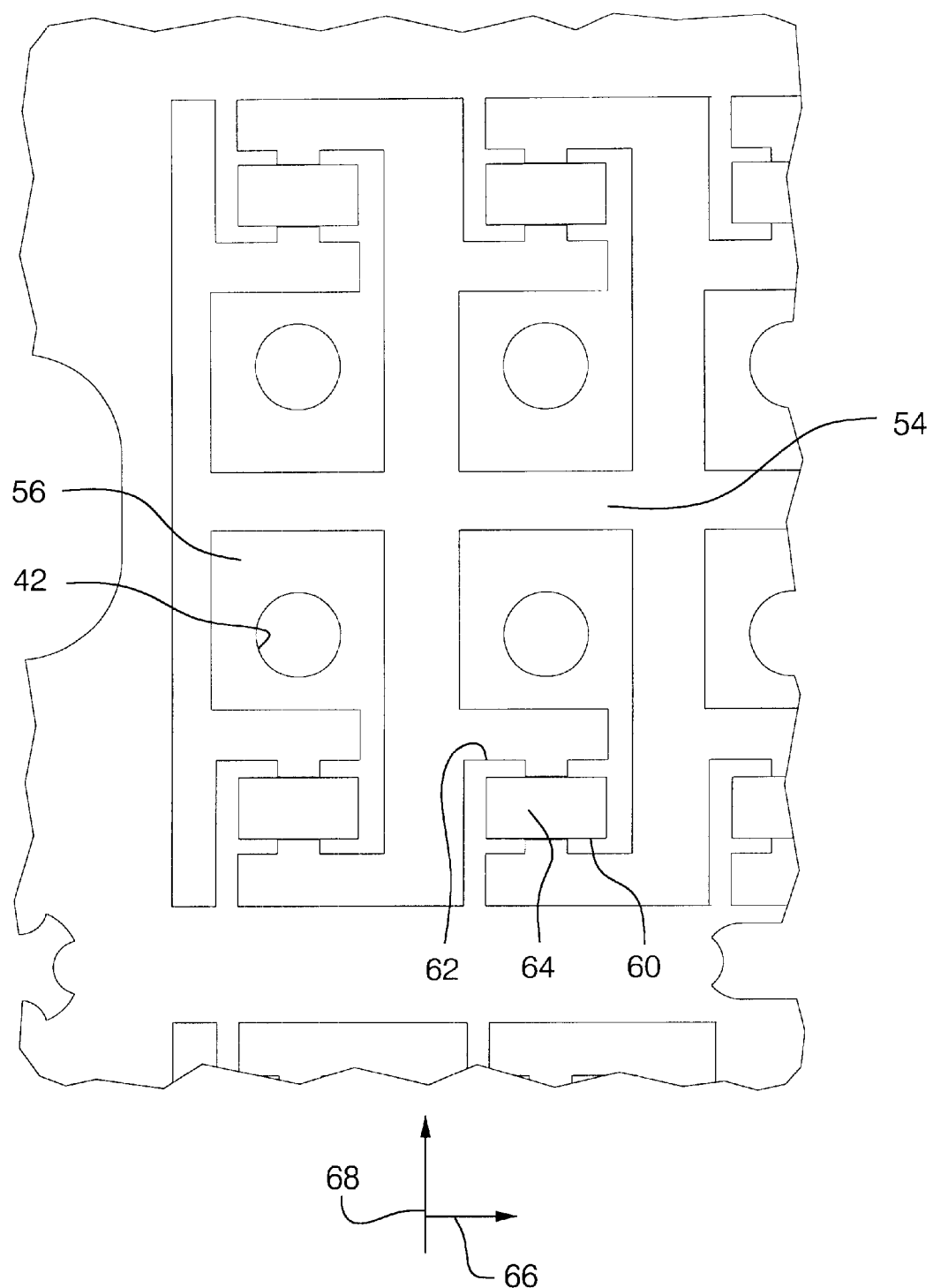
FIG. 7 is an enlarged, fragmentary, top view of the filter insert shown in FIGS. 5 and 6.

Contact pads 56 have a solder pad 60 for each plated hole 52 and upper ground plane 58 has several fingers 61 that provide a solder pad 62 spaced closely to each solder pad 60 as best shown in FIGS. 6 and 7. Solder pads 60 and 62 are coupled electrically by surface mounted electric filter devices, such as capacitors 64 that are soldered to closely spaced pairs of solder pads 60 and 62. Capacitors are well known and operate in a well known manner along with the ferrite inductive element to form an inductor-capacitor circuit to filter specific frequencies of electronic noise.

The flat plate filter 22 insert is molded of a plastic material having anisotropic thermal expansion properties, such as Amodel 1566 which is a high temperature thermoplastic material with 65% glass mineral filler marketed by Amoco Polymers.

The anisotropic properties are achieved by gating the mold for body 48 so that the plastic material flows longitudinally from one end to the other in the mold and body 48 is progressively formed from one end to the other, such as from left to right as shown in FIG. 5. Referring to FIG. 7, this molding technique aligns the glass mineral fibers longitudinally along and parallel to the X-axis of an imaginary Cartesian coordinate indicated by arrow 66, that is in the longitudinal direction from solder tab 62 to 60 or vice versa. This fiber alignment reduces the thermal expansion properties of body 48 in the longitudinal direction of the X-axis 66 in comparison to the thermal expansion properties of body 48 in the transverse direction of the imaginary Y-axis indicated by the arrow 68. The material thickness beneath the capacitors 64 is reduced to further reduce the expansion of the base material.

The surface mounted capacitors 64 are mounted onto insert 22 such that the major length of each capacitor 64 (having end contacts soldered to the respective solder tabs 60 and 62) is aligned with the flow direction of the plastic material in the molded insert 22. The coefficient of thermal expansion (CTE) of an anisotropic plastic material such as Amodel 1566 is lower in the flow direction indicated by arrow 66 than in the transverse or cross-flow direction indicated by arrow 68. This lower CTE reduces the effects of the mismatch between the CTE of ceramic capacitor 64 and the CTE of molded plastic insert 22 and thus the reliability of the solder joints between capacitors 64 and solder pads 60 and 62 is improved by aligning capacitors 64 along the flow direction of the plastic insert 22.

Filter insert 22 also uses relatively small capacitors, for instance 0603 style SMD capacitors which have a shorter length (0.060" mm) than the 0805 SMD capacitors (0.080 mm) of previous designs may be used. Shorter capacitors further reduce the dimensional mismatch (and therefore the stress) between capacitor 64 and the plastic substrate of body 48 due to thermal expansion. The smaller capacitor also has reduced thermal mass compared to the capacitor of previous designs, and this further contributes to improved solder joint reliability. In addition, the reduced size of capacitors 64 provides the ability to mount a large number of capacitors 64 in the flow direction of the plastic substrate of body 48 in a small space to meet stringent space requirements.

Encapsulation in an environmental coating such as a silicone based encapsulant over the solder joints, further improves the solder joint reliability by reducing crack propagation in the solder joint through prevention of moisture intrusion into a crack and prevention of oxidation of the solder in the area of a crack. Prevention of moisture intrusion eliminates stresses which are caused by expansion and contraction of the moisture during thermal excursions. Prevention of oxidation allows for the possibility of micro rewelding of the solder in the area of the crack, thus prolonging electrical continuity of the joint.

The flat plate filter insert 22 is a one-piece molded plastic substrate with a selective plating pattern of tin over copper. (A lead tin alloy of 98% tin and 2% lead is preferably used). The pattern of the selective plating is designed such that the circuit traces in the upper surface of insert 22 maintain a length-to-width ratio of less than 5-to-1, that is, the distance of any contact pin 20 to the nearest cast ground contact pin 40 of housing 12 is less than 5 times the diameter of the contact pin 20. This pattern keeps circuit trace impedance to a minimal level, which in turn provides for optimal filter performance. The filter circuit layout is designed so that every capacitor 64 has a minimal distance to the corresponding contact pin 20 of the connector and to the ground plane. Keeping these circuit traces to a minimum distance likewise keeps trace impedance to a minimum. Furthermore, the filter circuit layout is designed in conjunction with the aluminum connector housing 12 such that the interface of the filter circuit ground plane to the connector housing 12 is optimized. This is accomplished through a combination of features. The filter insert 22 interfaces with an array of pins 40 which are cast as part of the aluminum connector housing 12. Each of these cast pins mates to a plated through-hole 44 in the filter insert 22 via a press-fit interface. This press-fit interface provides both a mechanical retention force and an electrical interconnection of the filter insert ground plane to the aluminum connector housing 12 which also represents the RF (radio frequency) ground structure of the entire assembly. The location of the cast pins 40 of the housing 12 to the corresponding plated through-holes 44 of the electric filter insert 22 maintains the circuit length-to-width ratio less than 5-to-1, and minimizes the distance of any capacitor 64 to the contact or ground pin 40. (In the particular design disclosed, the maximum distance between any capacitor 64 and the ground pin 40 is 4.5 mm.).

The design of the plated plastic filter insert 22 provides additional advantages for grounding and shielding performance. The plated plastic filter insert 22 is constructed such that practically the entire surface area of the insert 22 is coated with the copper and tin platings. The areas which are not plated are the labyrinth areas 54 needed to define the circuit traces on the upper surface of insert 22 where the capacitors 64 are attached and the small ring areas 53 on the lower surface around each connector contact pin 20 to provide electrical isolation of each connector contact pin 20 from the ground plane. The advantage of such a configuration is that the filter insert 22 has a relatively large ground plane structure in and of itself, and it contains multiple electrical paths from any point on the ground plane to any of the cast ground pins 40 of the aluminum connector housing 12. All of these multiple electrical paths are electrically in parallel which results in a very low impedance path for the ground plane and results in optimal filter performance. Furthermore, the design of the plated areas is such that there are only minimal RF apertures in the ground plane structure. The only RF apertures are small ring areas 53 around each contact pin 20 on the lower surface and these are somewhat blocked by the circuit traces around each contact pin on the upper surface where capacitors 64 are surface mounted. This results in an extremely high degree of RF shielding, particularly since the majority of the area of the filter insert 22 actually provides two layers of shielding.

Housing 12 also has provision for external grounding to an engine block or other massive conductive structure (not shown) by one or more electric cables (not shown) being plugged into one of the grounding sockets 70 that are equipped with a male blade ground terminal 72.

While the plated plastic electric filter insert 22 has been illustrated with a particular pattern of plated through holes, conductive traces and surfaces and capacitors, other patterns are also possible. In other words, the invention has been described in an illustrative manner, and it is to be understood that the terminology, which has been used, is intended to be in the nature of words of description rather than of limitation.

Obviously, many modifications and variations of the present invention in light of the above teachings may be made. It is, therefore, to be understood that, within the scope of the appended claims, the invention may be practiced otherwise than as specifically described.

What is claimed is:

1. A filtered electrical connector for a printed circuit comprising:
    a housing having a shelf and a compartment that includes a socket in the bottom of the housing for attaching an end connector of a wiring harness to the housing,
    the compartment having a lower portion and an upper portion, the shelf facing away from the lower portion and exposed in the upper portion,
    a plastic retainer individually engaging each one of a plurality of contact pins extending through the retainer, the retainer disposed in the lower portion of the compartment with the contact pins extending downwardly into the socket and upwardly into the upper portion, and
    an electric filter insert disposed in the upper portion of the compartment and engaged to the shelf of the housing with the contact pins extending through the filter insert.

2. A filtered electrical connector for a printed circuit comprising:
    a housing having a compartment that includes a socket in the bottom of the housing for attaching an end connector of a wiring harness to the housing;
    the compartment having a lower portion and an upper portion;
    a plastic retainer individually engaging each one of a plurality of contact pins extending through the retainer, the retainer disposed in the lower portion of the compartment with the contact pins extending downwardly into the socket and upwardly into the upper portion; and
    an electric filter insert disposed in the upper portion of the compartment with the contact pins extending through the filter insert wherein the filter insert has a body comprising a plastic substrate having anistropic thermal expansion properties and electrical devices having major lengths that are oriented so that the major lengths of the electrical devices align in the direction of the reduced thermal expansion properties of the substrate.

3. The filtered electrical connector as defined in claim 2 wherein the substrate has a plurality of through holes that the contact pins extend through and the substrate is coated so that the through holes are conductive and a surface of the substrate includes conductive contact pads for the conductive through holes and a ground plane that surrounds the conductive contact pads.

4. The filtered electrical connector as defined in claim 3 wherein the conductive contact pads include solder pads and the ground plane includes fingers that provide ground solder pads that are spaced closely to respective ones of the solder pads of the contact pads.

5. The filtered electrical connector as defined in claim 4 wherein the solder pads and the ground solder pads are spaced from each other in the direction of the reduced thermal expansion properties of the substrate.

6. The filtered electrical connector as defined in claim 5 wherein the electrical devices are capacitors that are surface mounted on the body of the filter and have electrical contacts at the ends of their major lengths that are soldered to the respective solder pads and ground solder pads.

7. The filtered electrical connector as defined in claim 6 wherein the filter insert has ground holes extending through the insert, wherein the substrate of the filter insert is coated so that the ground holes are conductive, and wherein the housing is conductive and includes integral ground contact pins that are press fit in the ground contact holes to ground the ground plane to the housing.

8. A filtered electrical connector for a printed circuit comprising:

a housing having a compartment that includes a socket in the bottom of the housing for attaching an end connector of a wiring harness to the housing;

the compartment having a lower portion and an upper portion;

a plastic retainer having a plurality of contact pins extending through the retainer, the retainer disposed in the lower portion of the compartment with the contact pins extending downwardly into the socket and upwardly into the upper portion;

an electric filter insert disposed in the upper portion of the compartment with the contact pins extending through the filter insert wherein the filter insert has a body comprising a plastic substrate having anistropic thermal expansion properties and electrical devices having major lengths that are oriented so that the major lengths of the electrical devices align in the direction of the reduced thermal expansion properties of the substrate;

the substrate having a plurality of through holes that the contact pins extend through and the substrate is coated so that the through holes are conductive and a surface of the substrate includes conductive contact pads for the conductive through holes and a ground plane that surrounds the conductive contact pads;

the contact pads having solder pads and the ground plane having fingers that provide ground solder pads that are spaced closely to respective ones of the solder pads of the contact pads, wherein the solder pads and the ground solder pads are spaced from each other in the direction of the reduced thermal expansion properties of the substrate, and wherein the electrical devices are capacitors that are surface mounted on the body of the filter insert and have electrical contacts at the ends of the capacitor lengths that are soldered to the respective solder pads and ground solder pads;

the filter insert having ground holes extending through the insert, wherein the substrate of the filter insert is coated so that the ground holes are conductive, and wherein the housing is conductive and includes integral ground contact pins that are press fit in the ground contact holes to ground the ground plane to the housing; and the substrate being plated so that substantially the entire exposed surface of the substrate is conductive except for labyrinths on the upper surface that define the contact pads and fingers and for rings on the lower surface that isolate the contact holes.

9. The filtered electrical connector as defined in claim 1 further including a ferrite block that is disposed in the compartment above the filter insert, wherein the contact pins extend through the ferrite block.

10. The filtered electrical connector as defined in claim 9 wherein the filter insert is encapsulated in a sealant and the ferrite block has a bottom that is embedded in the sealant.

11. The filtered electrical connector as defined in claim 7 further including a ferrite block disposed in the compartment above the filter insert with the contact pins extending through the ferrite block and wherein the housing has a shelf that supports the integral ground contact pins and further supports integral pedestals that extend through the filter insert to support the ferrite block.

12. The filtered electrical connector as defined in claim 11 wherein the filter insert is encapsulated in a sealant and the ferrite block has a bottom that is embedded in the sealant.

13. An electric filter insert for an electrical connector having a plurality of contact pins comprising:

a body having a plastic substrate having anistropic thermal expansion properties, the substrate defining a plurality of through holes, each one of the plurality of contact pins extending through a respective one of the plurality of through holes, the plurality of contact pins thereby supported by the substrate; and electrical devices having major length that are oriented so that the major lengths of the electrical devices align in the direction of the reduced thermal expansion properties of the substrate.

14. The electric filter insert as defined in claim 13 wherein the substrate is coated so that the plurality of through holes are conductive and a surface of the substrate includes conductive contact pads for the conductive plurality of through holes and a ground plane that surrounds the conductive contact pads.

15. The electric filter insert as defined in claim 14 wherein the conductive contact pads include solder pads and the ground plane includes fingers that provide ground solder pads that are spaced closely to respective ones of the solder pads of the contact pads.

16. The electric filter insert as defined in claim 15 wherein the solder pads and the ground solder pads are spaced from each other in the direction of the reduced thermal expansion properties of the substrate.

17. The electric filter insert as defined in claim 16 wherein the electrical devices are capacitors that are surface mounted on the body of the filter insert and have electrical contacts at the ends of their major length that are soldered to the respective solder pads and ground solder pads.

18. The electric filter insert as defined in claim 17 wherein the filter insert has ground holes extending through the filter insert and wherein the substrate of the filter insert is coated so that the ground holes are conductive.

19. The filter insert as defined in claim 18 wherein the substrate is plated so that substantially the entire exposed surface of the body is conductive except for labyrinths on the upper surface that define the contact pads and ground planes and for the rings on the lower surface that isolate the contact holes.

* * * * *